United States Patent [19]

Tursky et al.

[11] Patent Number: 4,744,672
[45] Date of Patent: May 17, 1988

[54] SEMICONDUCTOR ARRANGEMENT

[75] Inventors: Werner Tursky; Reinhard Grube, both of Nuremberg; Hans-Jürgen Fuchs, Stein, all of Fed. Rep. of Germany

[73] Assignee: Semikron Gesellschaft für Gleichrichterbau und Elektronik mbH, Nuremberg, Fed. Rep. of Germany

[21] Appl. No.: 242,251

[22] Filed: Mar. 10, 1981

[30] Foreign Application Priority Data

Mar. 11, 1980 [DE] Fed. Rep. of Germany ....... 3009192

[51] Int. Cl.⁴ .................. G01K 7/00; H02H 7/125
[52] U.S. Cl. .................................. 374/178; 363/54; 250/552
[58] Field of Search ............ 73/362 SC, 344; 250/552; 363/54, 53, 57, 56

[56] References Cited

U.S. PATENT DOCUMENTS

| | | | |
|---|---|---|---|
| 2,504,628 | 4/1950 | Benzer | 374/178 |
| 3,102,201 | 8/1963 | Braunstein | 250/552 |
| 3,217,169 | 11/1965 | Grimmeis | 250/552 |
| 3,265,990 | 8/1966 | Burns | 250/552 |
| 3,303,431 | 2/1967 | Fowler | 250/552 |
| 3,398,311 | 8/1968 | Page | 250/552 |
| 3,416,047 | 12/1968 | Beale | 250/552 |

FOREIGN PATENT DOCUMENTS 1101947 2/1968 United Kingdom ................ 250/552

OTHER PUBLICATIONS

Conference on "Power Thyristors and Their Applications", May 6-8, 1969, Sponsored by The institute of Electrical Engineers, By B. V. Cordingley.

Primary Examiner—William A. Cuchlinski, Jr.
Assistant Examiner—Thomas B. Will
Attorney, Agent, or Firm—Spencer & Frank

[57] ABSTRACT

In a semiconductor arrangement including at least one semiconductor element composed of a semiconductor material which generates recombination radiation when current flows through the semiconductor element, and a control element disposed for monitoring the operation of the semiconductor element, the control element has an internal photoelectric effect and is disposed for receiving the recombination radiation generated in the semiconductor material for producing an output parameter representative of the intensity of such radiation.

3 Claims, 2 Drawing Sheets

SEMICONDUCTOR ARRANGEMENT

BACKGROUND OF THE INVENTION

The present invention relates to a semiconductor arrangement of the type composed of at least one semiconductor element and a control element which monitors the operation of the semiconductor element.

In order to prevent undue overloads during operation of a semiconductor element having a high current carrying capability, the operational parameters thereof, particularly its load current and temperature, must be monitored. For example, a bimetal switch or PTC resistor or NTC resistor is used as the thermal sensor and is connected to the semiconductor element to cause it to be switched off when a maximum permissible operating temperature is reached.

Such control elements, however, cannot be attached directly to the semiconductor body of the element. Due to thermal resistances existing between the semiconductor body and the control element, there is created a response delay which frequently prevents effective protection of the semiconductor element by such a thermal sensor.

Also known is the use of special semiconductor sensors. However, their use results in additional voltage and heat losses and sometimes requires a significant amount of additional space.

Under corresponding cases of overload, these relatively expensive safety elements are destroyed nevertheless and, finally, they are not reliable in all cases.

SUMMARY OF THE INVENTION

It is, therefore, an object of the invention to achieve the fastest possible and most reliable control of the electrical or thermal operating behavior of semiconductor elements. The present invention is based on the realization that when current flows through a semiconductor body, a so-called recombination radiation is created therein, that this radiation is infrared in nature, and that this infrared radiation is proportional to the current flow.

The above and other objects are achieved, according to the invention, in a semiconductor arrangement including at least one semiconductor element composed of a semiconductor material which generates recombination radiation when current flows through the semiconductor element, and a control element disposed for monitoring the operation of the semiconductor element, by providing, as the control element, an element having an internal photoelectric effect and by disposing that element for receiving the recombination radiation generated in the semiconductor material for producing an output parameter representative of the intensity of such radiation.

The control element is simultaneously provided to monitor the load current and the temperature of the semiconductor element.

The control element may be based on a semiconductor having at least one pn-junction and which monitors the temperature on the basis of its transmission, i.e. forward current, behavior or of its dark current behavior, or it may be a control element based on a semiconductor without a pn-junction and which monitors the temperature on the basis of a change in its dark resistance. In each case, the temperature monitoring is effected during the blocking phase of the semiconductor element.

BRIEF DESCRIPTION OF THE DRAWINGS

Identical parts bear the same reference numerals in all Figures.

DESCRIPTION OF THE PREFERRED EMBODIMENTS

Figure 1:
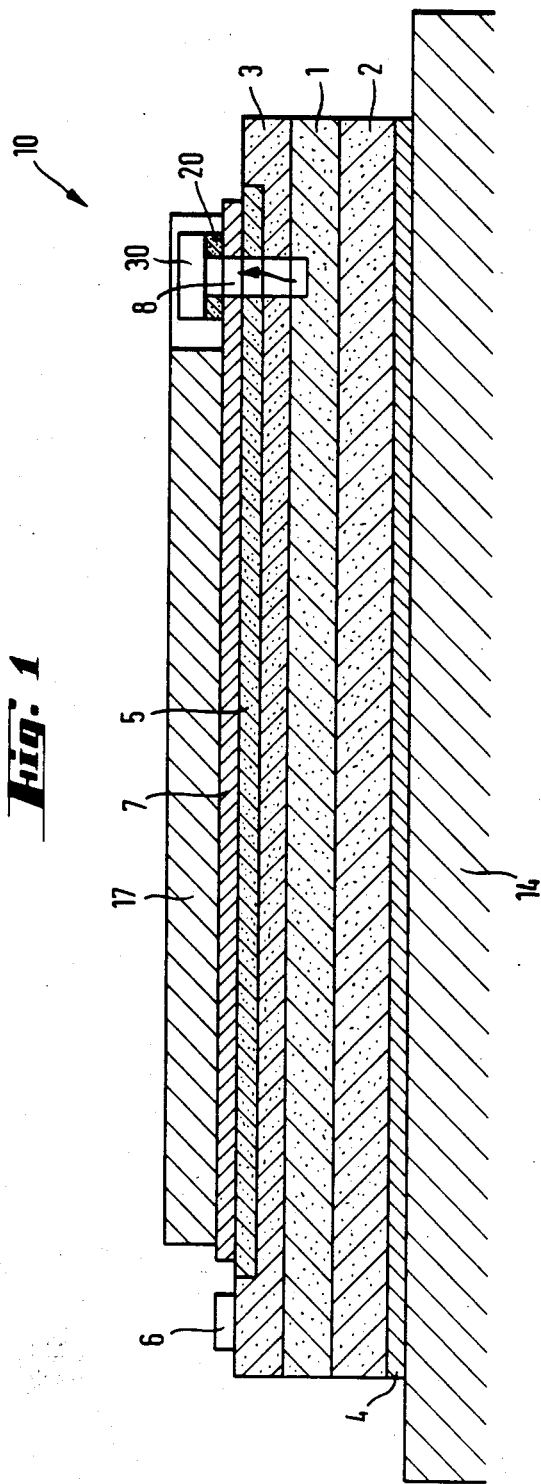
FIG. 1 is a cross-sectional view of the semiconductor body of a thyristor to be monitored and a control element fastened directly thereto according to the invention.

The semiconductor body 10 shown in FIG. 1, which forms a thyristor structure, includes a high-resistance, n-conductive center zone 1, more highly doped p-conductive zones 2 and 3, each adjacent a respective side of the center zone 1, a highly doped n-conductive zone 5 inserted into the upper zone as well as contact electrodes 4 and 7, respectively, applied to the outer zones 2 and 5, respectively, for conduction of the load current, and a control electrode 6 applied to the p-conductive zone 3 for the application of control signals. This layer structure is secured between conductor members 14 and 17.

According to the present invention, the semiconductor body 10 is provided with an aperture 8 which extends from one surface, for example from the contact electrode 7, into the p-conductive zone 3, and possibly also layer 1, and serves as a radiation window for the recombination radiation generated in the semiconductor body during current flow.

Due to the tendency of highly doped semiconductor material to absorb the recombination radiation, it is not sufficient to merely expose a surface of the semiconductor body in order to produce a radiation surface; rather it is necessary to provide an aperture such as aperture 8 which extends to the depth of one of the highly doped zones. The cross section of the aperture 8 is adapted to the illumination, or receiving, surface of the intended control element.

The position of the aperture 8 is selected essentially arbitrarily. For reasons of technology, however, it is preferably disposed at the edge of the surface defined by the contact electrode 7, for example in a recess in conductor 17. In principle, the recombination radiation must exit the semiconductor material and impinge on the surface of the control element to be illuminated. Consequently, the control element is attached in a corresponding manner with its surface section intended to be illuminated to the semiconductor body.

In the arrangement shown in FIG. 1, the control element 30 is fastened to the appropriately prepared surface section of the semiconductor body 10 via an electrical insulating layer 20. The fastening of an associated electrical insulating body 20 as well as of the control element 30 can be effected, for example, by gluing or by soldering. The insulating body 20 may be, for example, a suitably adapted annular disc made of an oxide ceramic, whose surfaces are connected with the adjacent components and which has a recess in its central region for the passage of the radiation onto the monitoring element surface to be illuminated.

Alternatively, the insulating body 20 may be a disc of quartz, since quartz permits unrestricted passage of the recombination radiation.

Another possibility is to provide a suitable mount via which the control element 30 can be fastened to the insulating body 20 in a suitable manner and in which the control element is held.

The entire exposed surface defining aperture 8 can be provided with a layer of the oxide of the semiconductor material as a protective coating.

The aperture 8 can be produced by etching or by other known removal processes. As described, the control element 30 is thermally coupled with the semiconductor body 10. This permits, in an optimum manner, monitoring of the current in the semiconductor element as well as monitoring of its operating temperature, which may increase in an undesirable manner, for example, due to malfunction of the cooling system provided for the semiconductor element or due to worsening of heat transfer in the structure of the semiconductor element.

There are provided control elements based on a semiconductor without pn-junction, i.e., so-called photoresistors, and those based on a semiconductor having at least one pn-junction, i.e. photodiodes and phototransistors.

As already explained above, the recombination radiation in the semiconductor body is proportional, over a wide range, to the current flow through the semiconductor body. The present invention takes advantage of this fact as well as of the fact that in control elements having a pn-junction the transmission behavior of such elements as well as their dark current, and in photoresistors their dark resistance, can be put into a relationship to the operating temperature of the control element and thus also of the semiconductor element to be monitored. Thus it is possible, in a surprisingly simple manner, to monitor the parameters of semiconductor elements essentially without power consumption or delay.

Figure 2:
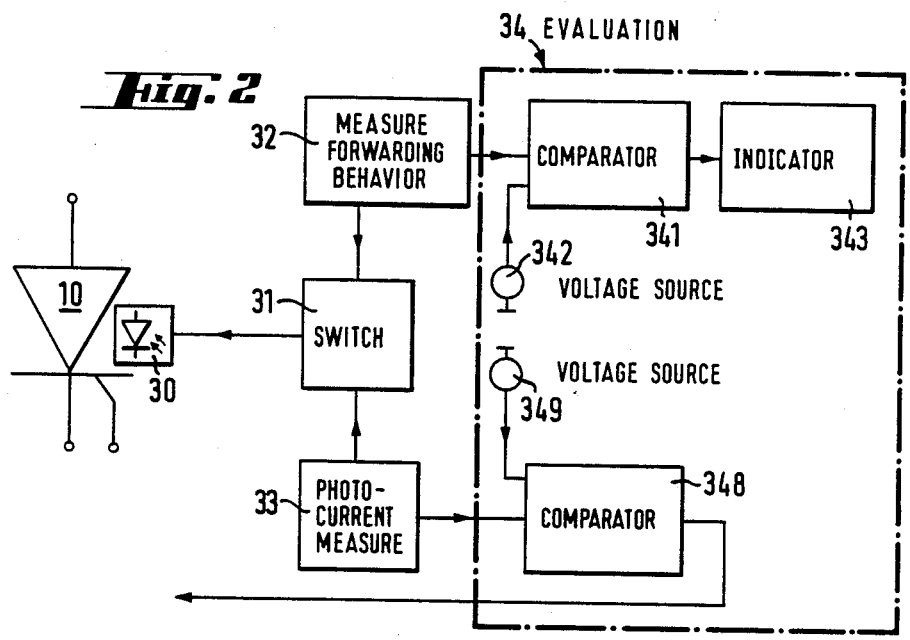
FIG. 2 is a schematic representation of a semiconductor arrangement according to the invention and a block diagram of a circuit arrangement suitable for evaluating the operation of the control element.

FIG. 2 shows that, for example, a photodiode 30 is connected, via a switch 31, to a measuring circuit 32 for determining the forward voltage drop across the photodiode, on the one hand, and to a measuring circuit 33 for measuring the photocurrent, on the other hand. The switch is here preferably switchable with the aid of a mains-synchronous clock pulse generator in the rhythm of the mains frequency half waves so that the two monitoring operations are performed sequentially during alternate half periods of the mains voltage. A current generator in the measuring circuit 32 for the photodiode 30 delivers a constant forward current into the photodiode 30 and, in dependence on the thermal coupling of the photodiode with the element to be protected, the forward voltage drop across the photodiode is detected. This forward voltage drop changes in inverse proportion to the ambient temperature so that a direct comparison of the measured values with the operating temperature being monitored is possible.

On the other hand, the photodiode 30 is supplied in its blocking direction with a fixed voltage from a voltage source in the measuring circuit 33 and the photo current is registered as a function of the illumination intensity on the illumination surface of the control element 30. The circuits as such as well as the measures for measuring electrical parameters of the control element 30 and, if required, to amplify the same, are well known and are not, per se, part of the present invention.

Since the dark current is a function of the photodiode temperature, it is possible, in view of the applicability of the intended control element for high frequencies as well, to monitor the temperature on the basis of the dark current. In connection with the determination of measured values, for example, a suitable error detection may be provided and, if the element being monitored is a thyristor, a signal to block firing may be provided to the firing circuit of this element.

The evaluation of the measuring results can thus be effected in a known manner by means of an evaluation circuit 34 constructed according to principles well known in the electronic art. For the temperature monitoring such an evaluation circuit consists for example of a comparator 341, a voltage source 342 and an indicating instrument 343. With the comparator 341 a reference voltage according to the lower limit of the forward voltage is compared with the measured voltage drop (depending on temperature). The voltage source 342 supplies the reference voltage. By aid of a calibration curve showing the relationship between forward voltage and temperature the device temperature may be indicated with the instrument 343.

Further for the photocurrent measurement or the current monitoring a respective comparator 348 and a voltage source 349 are provided. Said voltage source supplies a reference voltage according to the upper limit of the photocurrent. The evaluation can be made thereby that the signal of the comparator 348 is supplied to the firing circuit of the thyristor 10 in order to effect a firing stop.

The block circuit diagram shown in FIG. 2 is not limited to a connection with only one control element. Rather, for example for a semiconductor rectifier circuit including six rectifier elements, all six control elements can be connected to the one illustrated monitoring circuit.

Figure 3:
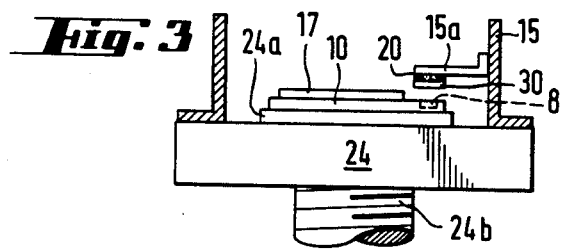
FIG. 3 is an elevational view partially in cross section of the structure of a semiconductor element with parts of its housing and with a control element which is thermally fastened to the housing according to an embodiment of the invention.

FIG. 3 shows another possibility for attaching a control element. A substrate 24, preferably of copper, which simultaneously serves as a current conductor and as the bottom portion of the housing and includes a screw stud 24b, is provided at its upper face with a projection 24a for the attachment of the semiconductor body 10. The latter is provided with an aperture 8 like that of FIG. 1. The control element 30 is attached to the inside of the upper portion 15 of a housing, which is shown only in part, through the intermediary of an electrical insulating body 20, in a mount 15a in such a manner that the recombination radiation exiting from the aperture of the semiconductor body 10 impinges on the sensing surface of the control element. It is understood that the assembly of such an arrangement will be significantly aided by special markings on the housing members so that they are positioned in a defined mutual spatial association in order to assure functioning of the control element.

The mount 15a is preferably made of a metal with good heat conducting properties so as to optimally couple the control element to the housing 15 and is attached in such a manner that the distance between the control element 30 and the semiconductor 10 is as small as possible.

Such a thermal coupling results in a certain amount of inertia, or delay, in the monitoring function, compared to a direct connection with the semiconductor body, due to the longer heat flow path to the control element, but it appears to be of particular advantage for monitoring heating resistors in the structure of the element being monitored or for monitoring the operation of a cooling device, respectively. Of course, the control element 30 can also be fastened to a suitable location on the substrate 24.

The connecting leads for the control element may be introduced, for example, through the top of the housing via a ceramic pipe.

Figure 4:
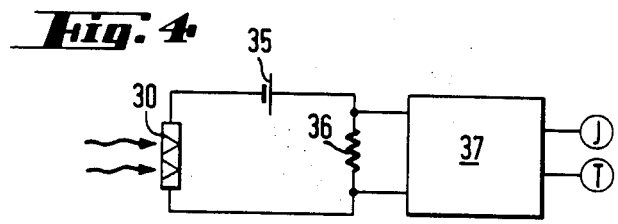
FIG. 4 is a schematic representation of a circuit including a photoresistor which is connected with a monitoring circuit and is to be fastened to a semiconductor element in a suitable manner.

According to the illustration in FIG. 4, a photoresistor 30 is exposed to radiation from the semiconductor body as symbolized by an arrow. According to the relationship between photocurrent and illumination intensity, e.g. in a photodiode, the so-called bright resistance of the control element 30 is a function of the intensity of the illumination to which it is exposed.

In the monitoring circuit, the photoresistor 30 receives an operating voltage from a battery 35. The photocurrent generated in the photoresistor by illumination produces a change in its resistance which is evaluated on the basis of the voltage drop across measuring resistor 36, by means of a conventional measuring circuit 37 which is connected in parallel therewith and is not, per se, part of the invention. With essentially the same basic circuit, the dark resistance of the control element 30 as a function of the operating temperature of that element and of the semiconductor element can also be used as a basis for monitoring that temperature.

To produce a structure as shown in FIG. 3, the semiconductor 10 is initially applied to the pretreated substrate 24 and the upper connecting lead, of which component 17 represents only a part, is then applied to the semiconductor body 10.

The mount 15a supporting the control element can be firmly connected with the upper portion 15 of the housing, for example by soldering or welding or with the aid of a metal adhesive. With the aid of suitable markings, the upper portion 15 of the housing is then fastened to the substrate 24.

The advantage of the present invention is an essentially power-free and inertia-free as well as a true-to-phase and frequency independent monitoring of parameters in semiconductor devices through the use of known components having a photoelectric effect.

Infrared recombination radiation during the current flow occurs with a semiconductor body which includes at least one pn-junction and which consists of a material with an energy gap $E_g \leq 1.55$ eV, e.g. silicon, germanium, gallium arsenide. A photodiode as a control element with at least one pn-junction consists of a semiconductor body wherein the pn-junction is located closely to the surface to be radiated. Electrical charges resulting from radiation are separated within the space charge layer at the pn-junction. Thus a provable current is generated. Both the reverse current and the forward voltage drop of the photodiode depend on the temperature whereby the sensitiveness of temperature of the photodiode is caused.

With a photoresistor as a control element without pn-junction a piece of semiconductor material is attached to contacting members. By illumination of the semiconductor charges are generated and thereby the specific resistance of the semiconductor material changes. Moreover the specific resistance depends on the temperature and therefrom the sensitiveness of temperature of the photoresistor results.

It will be understood that the above description of the present invention is susceptible to various modifications, changes and adaptations, and the same are intended to be comprehended within the meaning and range of equivalents of the appended claims.

What is claimed is:

1. In a power semiconductor arrangement including at least one power semiconductor element with high current carrying capability composed of a semiconductor material which generates recombination radiation when current flows through the semiconductor element, a control element disposed for monitoring the operation of said semiconductor element, with said control element comprising a device having an internal photoelectric effect and disposed for receiving the recombination radiation generated in said semiconductor material for producing an output parameter representative of the intensity of such radiation, and monitoring means connected to said control element for regulating the current flowing through said semiconductor element as a function of the output parameter; the improvement wherein: said monitoring means is operative for monitoring the current through, and the temperature of, said semiconductor element; said control element is a semiconductor-based device having at least one pn-junction; and said monitoring means cooperate with said control element for monitoring the temperature of said semiconductor element, on the basis of the forward current behavior of said control element, during the reverse bias phases of said semiconductor element.

2. In a power semiconductor arrangement including at least one power semiconductor element with high current carrying capability composed of a semiconductor material which generates recombination radiation when current flows through the semiconductor element, a control element disposed for monitoring the operation of said semiconductor element, with said control element comprising a device having an internal photoelectric effect and disposed for receiving the recombination radiation generated in said semiconductor material for producing an output parameter representative of the intensity of such radiation, and monitoring means connected to said control element for regulating the current flowing through said semiconductor element as a function of the output parameter; the improvement wherein: said monitoring means is operative for monitoring the current through, and the temperature of, said semiconductor element; said control element is a semiconductor-based device having at least one pn-junction; and said monitoring means cooperate with said control element for monitoring the temperature of said semiconductor element, on the basis of the dark current behavior of said control element, during the reverse bias phases of said semiconductor element.

3. In a power semiconductor arrangement including at least one power semiconductor element with high current carrying capability composed of a semiconductor material which generates recombination radiation when current flows through the semiconductor element, a control element disposed for monitoring the operation of said semiconductor element, with said control element comprising a device having an internal photoelectric effect and disposed for receiving the recombination radiation generated in said semiconductor material for producing an output parameter representative of the intensity of such radiation, and monitoring means connected to said control element for regulating the current flowing through said semiconductor element as a function of the output parameter; the improvement wherein: said monitoring means is operative for monitoring the current through, and the temperature of, said semiconductor element; said control element is a semiconductor-based device without a pn-junction; and said monitoring means cooperate with said control element for monitoring the temperature of said semiconductor element, on the basis of the value of the dark resistance of said control element, during the reverse bias phases of said semiconductor element.

* * * * *